United States Patent
Hatcher et al.

(10) Patent No.: US 9,711,414 B2
(45) Date of Patent: Jul. 18, 2017

(54) STRAINED STACKED NANOSHEET FETS AND/OR QUANTUM WELL STACKED NANOSHEET

(71) Applicant: Samsung Electronics Co., Ltd., Gyeonggi-do (KR)

(72) Inventors: Ryan M. Hatcher, Round Rock, TX (US); Robert C. Bowen, Austin, TX (US); Mark S. Rodder, Dallas, TX (US); Borna J. Obradovic, Leander, TX (US); Joon Goo Hong, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/887,484

(22) Filed: Oct. 20, 2015

(65) Prior Publication Data

US 2016/0111337 A1    Apr. 21, 2016

Related U.S. Application Data

(60) Provisional application No. 62/066,364, filed on Oct. 21, 2014.

(51) Int. Cl.
*H01L 21/8238* (2006.01)
*H01L 29/78* (2006.01)
(Continued)

(52) U.S. Cl.
CPC ........... *H01L 21/823807* (2013.01); *H01L 21/823828* (2013.01); *H01L 29/0665* (2013.01); *H01L 29/66484* (2013.01); *H01L 29/7847* (2013.01)

(58) Field of Classification Search
CPC ............ H01L 29/0665; H01L 29/0673; H01L 29/15–29/155; H01L 29/26;
(Continued)

(56) References Cited

U.S. PATENT DOCUMENTS 6,940,129 B2    9/2005 Kim et al.
7,147,709 B1   12/2006 Ong et al.
(Continued)

OTHER PUBLICATIONS

U.S. Appl. No. 14/830,622, titled "Rectangular Nanosheet Fabrication," filed Aug. 19, 2015 and assigned to Samsung Electronics Co., Ltd.

*Primary Examiner* — Bryan Junge
(74) *Attorney, Agent, or Firm* — Convergent Law Group LLP

(57) ABSTRACT

Exemplary embodiments provide for fabricating a biaxially strained nanosheet. Aspects of the exemplary embodiments include: growing an epitaxial crystalline initial superlattice having one or more periods, each of the periods comprising at least three layers, an active material layer, a first sacrificial material layer and a second sacrificial material layer, the first and second sacrificial material layers having different material properties; in each of the one or more periods, placing each of the active material layers between the first and second sacrificial material layers, wherein lattice constants of the first and second sacrificial material layers are different than the active material layer and impose biaxial stress in the active material layer; selectively etching away all of the first sacrificial material layers thereby exposing one surface of the active material for additional processing, while the biaxial strain in the active material layers is maintained by the second sacrificial material layers; and selectively etching away all of the second sacrificial material layers thereby exposing a second surface of the active material layers for additional processing.

30 Claims, 18 Drawing Sheets

(51) Int. Cl.
*H01L 29/06* (2006.01)
*H01L 29/66* (2006.01)

(58) Field of Classification Search
CPC ............. H01L 29/267; H01L 29/66484; H01L 29/7831; H01L 29/78645
See application file for complete search history.

(56) References Cited

U.S. PATENT DOCUMENTS

| | | |
|---|---|---|
| 7,253,060 B2 | 8/2007 | Yun et al. |
| 7,537,953 B2 | 5/2009 | Tateishi et al. |
| 7,579,656 B2 | 8/2009 | Kang et al. |
| 7,973,336 B2 | 7/2011 | Savage et al. |
| 8,124,961 B2 | 2/2012 | Suk et al. |
| 8,178,924 B2 | 5/2012 | Oh et al. |
| 8,324,056 B2 | 12/2012 | Son et al. |
| 8,367,491 B2 | 2/2013 | Son et al. |
| 8,492,187 B2 | 7/2013 | Cheng et al. |
| 2012/0040528 A1 | 2/2012 | Kim |
| 2012/0302047 A1 | 11/2012 | Lee |
| 2013/0270512 A1 | 10/2013 | Radosavlijevic |
| 2014/0239353 A1 | 8/2014 | Daneman |
| 2016/0079394 A1* | 3/2016 | Li .................... H01L 29/66795 257/347 |
| 2016/0276484 A1* | 9/2016 | Kim ................... H01L 29/7851 |

\* cited by examiner

Spacer 500  Dummy Source/Drain 502

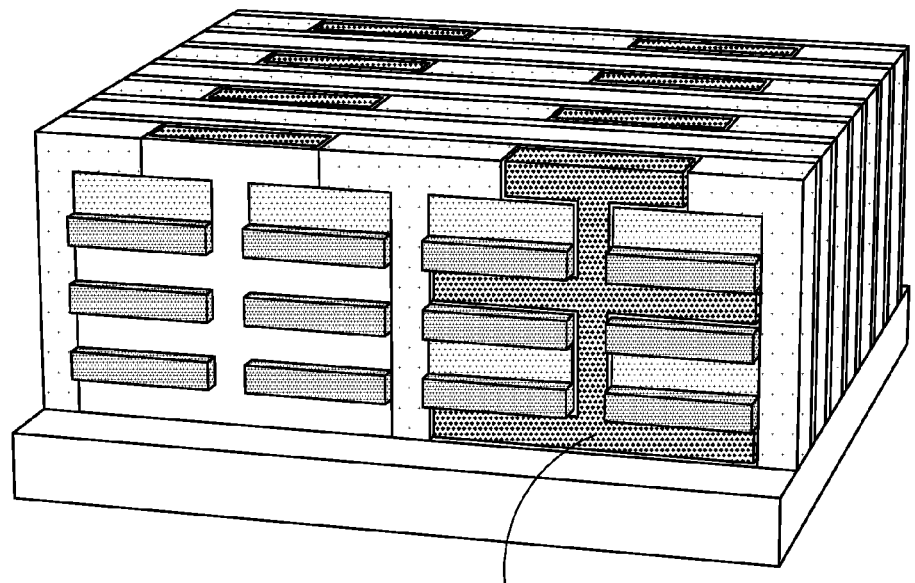
FIG. 14A  Metal Fill 1400
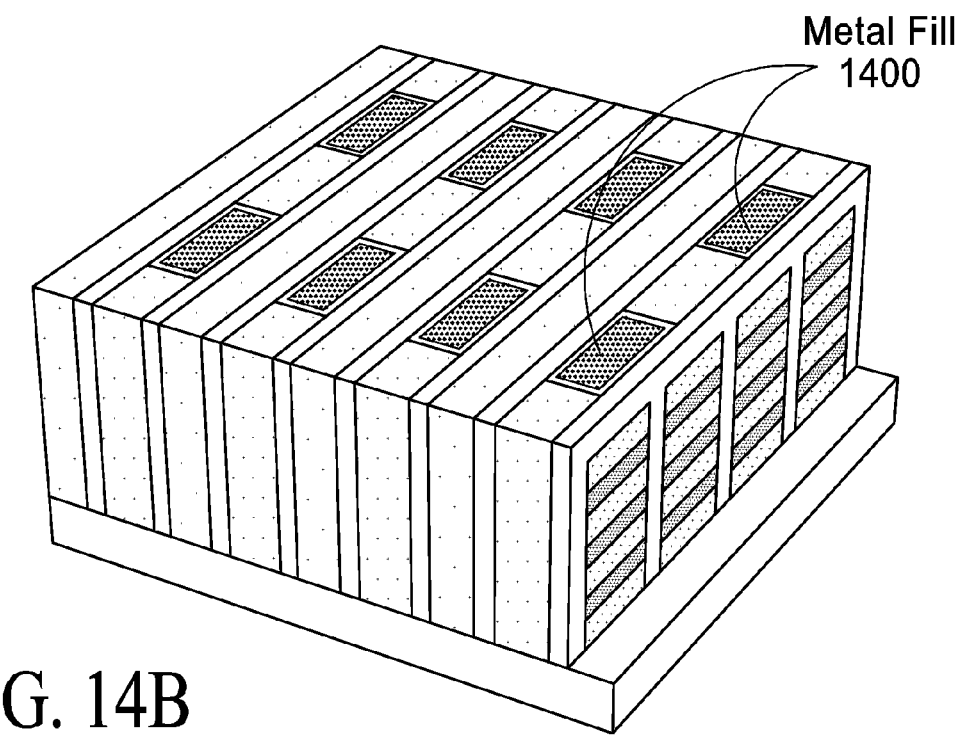
FIG. 14B  Metal Fill 1400

Metal Fill 1800

Metal Fill 1800

Chamfer/Recess

Strap/Tie Together

STRAINED STACKED NANOSHEET FETS AND/OR QUANTUM WELL STACKED NANOSHEET

CROSS-REFERENCE TO RELATED APPLICATIONS

This application claims the benefit of priority of provisional Patent Application Ser. No. 62/066,364 filed on Oct. 21, 2014. This application is also related to patent application Ser. No. 14/830,622 filed on Aug. 19, 2015, both assigned to the assignee of the present application and herein incorporated by reference.

BACKGROUND

Advanced CMOS nodes require multi-gate architectures in order to achieve sufficient electrostatic control to modulate current in short channels. A multi-level nanosheet device is a promising architecture for advanced nodes as it may offer excellent mobility, electrostatic control and possible layout enhancements. In addition, nanosheet architecture may compare favorably to the alternatives because the roughness of the channel/dielectric interface is limited by the precision of broad area epitaxial growth and selective etching instead of, e.g., lithography and anisotropic etching as is the case for FinFETs (field effect transistors)

Adoption of nanosheets in advanced CMOS nodes (i.e. <=7 nm) face the following several challenges. One challenge is that highly selective etches must exist in order to ensure that the thickness of the nanosheet remains uniform from middle to end. Prior techniques use Si/SiGe superlattices where either Si or SiGe layers comprise the active material in the final structure, whereas the SiGe or Si layers, respectively, serve as sacrificial layers to be selectively etched away. The selectivity of etches for the Si/SiGe system is limited to relatively low values due to the chemical similarity between Si and SiGe. However, this problem has been addressed by U.S. patent application Ser. No. 14/830, 622 filed on Aug. 19, 2015, "Rectangular Nanosheet Fabrication Method".

Another challenge facing adoption of nanosheets in advanced CMOS nodes is the introduction of strain into the channel (nanosheet channel layers) of the final structure. In order to meet advanced CMOS performance targets, it will likely be necessary for significant strain to be engineered into the channel for n- or p-type Si, SiGe or Ge channels and even some p-type III/V channels (e.g., GaSb). Prior techniques utilize a method to fabricate nanosheets whereby any strain introduced by the original superlattice is lost during processing.

What is needed is a fabrication method that will result in a nanosheet final structure that retains biaxial strain from the original superlattice.

BRIEF SUMMARY

Exemplary embodiments provide for fabricating a biaxially strained nanosheet. Aspects of the exemplary embodiments include: growing an epitaxial crystalline initial superlattice having one or more periods, each of the periods comprising at least three layers, an active material layer, a first sacrificial material layer and a second sacrificial material layer, the first and second sacrificial material layers having different material properties; in each of the one or more periods, placing each of the active material layers between the first and second sacrificial material layers, wherein lattice constants of the first and second sacrificial material layers are different than the active material layer and impose biaxial stress in the active material layer; selectively etching away all of the first sacrificial material layers thereby exposing one surface of the active material for additional processing, while the biaxial strain in the active material layers is maintained by the second sacrificial material layers; and selectively etching away all of the second sacrificial material layers thereby exposing a second surface of the active material layers for additional processing.

BRIEF DESCRIPTION OF SEVERAL VIEWS OF THE DRAWINGS

These and/or other features and utilities of the present general inventive concept will become apparent and more readily appreciated from the following description of the embodiments, taken in conjunction with the accompanying drawings of which:

FIGS. 14A and 14B are diagrams illustrating results of metal fill;

DETAILED DESCRIPTION

Figure 1:
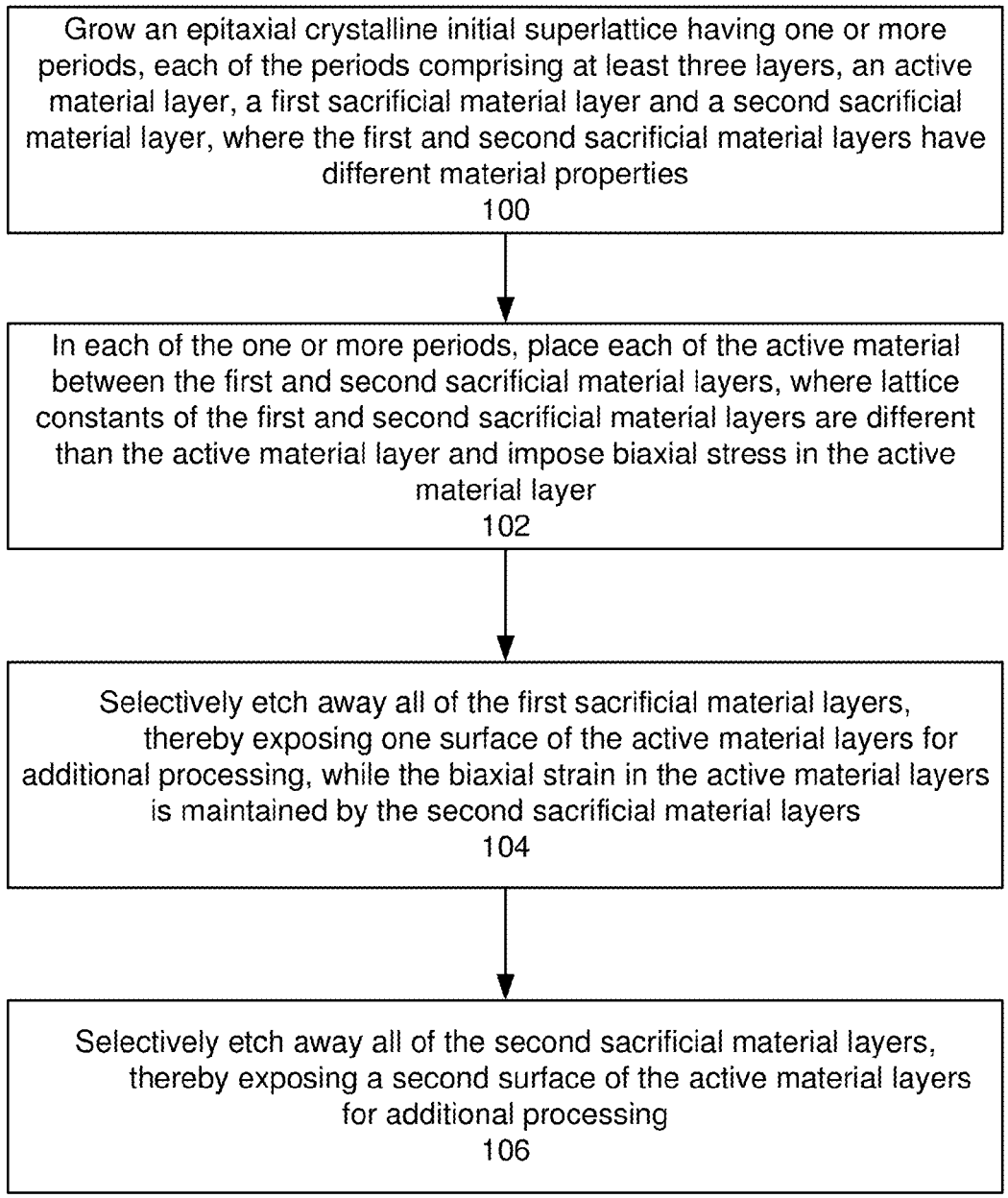
FIG. 1 is a flow diagram illustrating a process for fabricating a biaxially strained nanosheet according to one embodiment.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Advantages and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. In the drawings, the thickness of layers and regions are exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The exemplary embodiments provide a process for fabricating biaxially strained nanosheets (i.e., nanosheet channel layers) for advanced CMOS devices. The nanosheet structure is fabricated by epitaxially growing a (generally) single crystal superlattice comprising alternating layers of active material and sacrificial materials. The sacrificial layers on either side of (or adjacent to) every active layer comprise different materials. Introduction of the biaxial strain in the nanosheets may originate from a difference in lattice constants between the active and sacrificial materials of the original superlattice.

FIG. 1 is a flow diagram illustrating a process for fabricating a biaxially strained nanosheet according to one embodiment. The processing steps described below are not necessarily immediate subsequent steps, but are incorporated (at the appropriate steps) into known flows for fabrication of nanosheet FET devices.

The process may begin by growing an epitaxial crystalline initial superlattice having one or more periods, each of the periods comprising at least three layers, an active material layer, a first sacrificial material layer and a second sacrificial material layer, where the first and second sacrificial material layers have different material properties (block 100).

In each of the one or more periods, each of the active material layers are placed between the first and second sacrificial material layers, where lattice constants of the first and second sacrificial material layers are different than the active material layer and impose biaxial stress in the active material layer (block 102).

All of the first sacrificial material layers are selectively etched away, thereby exposing one surface of the active material layers for additional processing, while the biaxial strain in the active material layers is maintained by the second sacrificial material layers (block 104). All of the second sacrificial material layers are selectively etched away, thereby exposing a second surface of the active material layers for additional processing (block 106).

In one embodiment, an example of the additional processing steps after the removal of each sacrificial material layers include the deposition of materials that re-pin the free surface of the active material layers, thus maintaining the biaxial strain in the active layers. For example, in one embodiment, the additional processing may include depositing a first gate stack in regions where the first sacrificial material layers were selectively etched away, where the first gate stack is capable of maintaining the biaxial stress. The additional processing may also include depositing a second gate stack in regions where the second sacrificial material layers were selectively etched away.

In one embodiment, the biaxially strained nanosheet may be tensile-strained, and the biaxially strained nanosheet may comprise a first field effect transistor (FET) type of a CMOS nanosheet FET circuit. In another embodiment, the biaxially strained nanosheet may be compressively-strained, and the biaxially strained nanosheet may comprise a second FET type of a CMOS nanosheet FET circuit.

In one embodiment, a width of the biaxially strained nanosheet ranges from 5-50 nm, a thickness of the biaxially strained nanosheet ranges from 2-10 nm, vertical spacing between two biaxially strained nanosheets ranges from 5-20 nm, and the horizontal spacing between the biaxially strained nanosheets ranges from 5-20 nm. In another embodiment, the width of the biaxially strained nanosheet ranges from 10-40 nm, the thickness of the biaxially strained nanosheet ranges from 4-7 nm, the vertical spacing between two of the biaxially strained nanosheets ranges from 7-15 nm, and the horizontal spacing between the biaxially strained nanosheets ranges from 7-15 nm.

In one embodiment, the first gate stack comprises first gate dielectric materials and first metal materials, and the second gate stack comprises second gate dielectric materials and second metal materials. In one embodiment, the first gate dielectric materials may be substantially the same or different from the second gate dielectric materials, and/or first metal materials may be substantially the same or different from the second metal materials.

In one embodiment, a separation of the first metal material and the second metal material in at least one region of a nanosheet FET structure may be larger than a separation of the first metal material and the second metal material from a first surface and second surface of the nanosheet, respectively. In one embodiment, the separation of the first metal material and second metal material in a region of the nanosheet FET comprises adjacent layers of first gate dielectric materials and second gate dielectric materials.

In one embodiment, the first gate stack is substantially the same as the second gate stack, while in another embodiment, the first gate stack is different from the second gate stack. In one embodiment, the first gate stack may have a first effective workfunction and the second gate stack may have a second effective workfunction.

In one embodiment, the first metal material and second metal material are connected together in at least one region of a nanosheet FET structure. In another embodiment, the first metal material and second metal material are not connected together.

Additional subtractive/etch steps may precede or follow along with the deposition of supporting structures (e.g. spacers and or dummy fills). Each sacrificial material is selectively etched away during the fabrication process. The sacrificial materials should generally have the following three properties. The first property is that each of the sacrificial materials should admit high quality growth (i.e. sufficiently low defectivity) of the sacrificial materials on the active material and vice versa. The second property is that each of the sacrificial materials should be sufficiently different from the active material such that a highly selective etch can be developed that leaves active material substantially and/or sufficiently unaffected.

The third property is that the chemistry of each of the sacrificial material layers should be sufficiently different from the other sacrificial material layer(s) such that a highly selective etch can be developed that leaves the other sacrificial material layer(s) substantially and/or sufficiently unaffected. For example, sacrificial material 1 can be etched selective to sacrificial material 2, and vice versa, where the etching of each is selective to the active material.

According to one embodiment, a nanosheet FET structure may be constructed from the superlattice as described above, where the active material layer may comprise i) Si (silicon), ii) Si and Ge (silicon-germanium), or iii) Ge (germanium). In one embodiment, one of the sacrificial material layers may comprise a III-V alloy and the other sacrificial material layer may comprise a different, chemically dissimilar III-V alloy, or a II-VI alloy. In one embodiment, one of the sacrificial material layer may comprise II-VI alloy and the other sacrificial material layer may comprise a different, chemically dissimilar II-VI.

In one embodiment, the active material layer may comprise a III-V alloy or a II-VI alloy. In one embodiment, the first sacrificial material layer may comprise a different III-V than the active layer and the other sacrificial material layer may comprise a different III-V from the active layer and the first sacrificial material layer. In another embodiment, the first sacrificial material layer may comprise a different III-V than the active layer and the other sacrificial material layer may comprise a II-VI alloy. In these embodiments, each of the III-V materials must be chemically dissimilar in order to allow for highly selective etches.

In yet another embodiment, one sacrificial material layer may comprise a II-VI alloy and the other sacrificial material layer may comprise a different, chemically dissimilar II-VI alloy. In one embodiment, one sacrificial material layer may comprise a III-V alloy and the other sacrificial material may comprise a different, chemically dissimilar III-V. In one embodiment, one sacrificial material layer may comprise a different II-VI alloy than the active material layer and the other sacrificial material layer may comprise a III-V alloy. In another embodiment, one sacrificial material layer may comprise a different II-VI than the active layer and the other sacrificial material layer may comprise a different II-VI alloy from the active material layer and the first sacrificial material layer. In these embodiments, the II-VI materials must be chemically dissimilar in order to allow for highly selective etches.

In one embodiment, the sacrificial material layers impose tensile biaxial strain in the active material layers. In another embodiment, the sacrificial material layers impose compressive biaxial strain in the active material layers. In these embodiments, the first and second sacrificial material layers are removed in separate steps corresponding to the two different sacrificial materials.

Figure 2A:
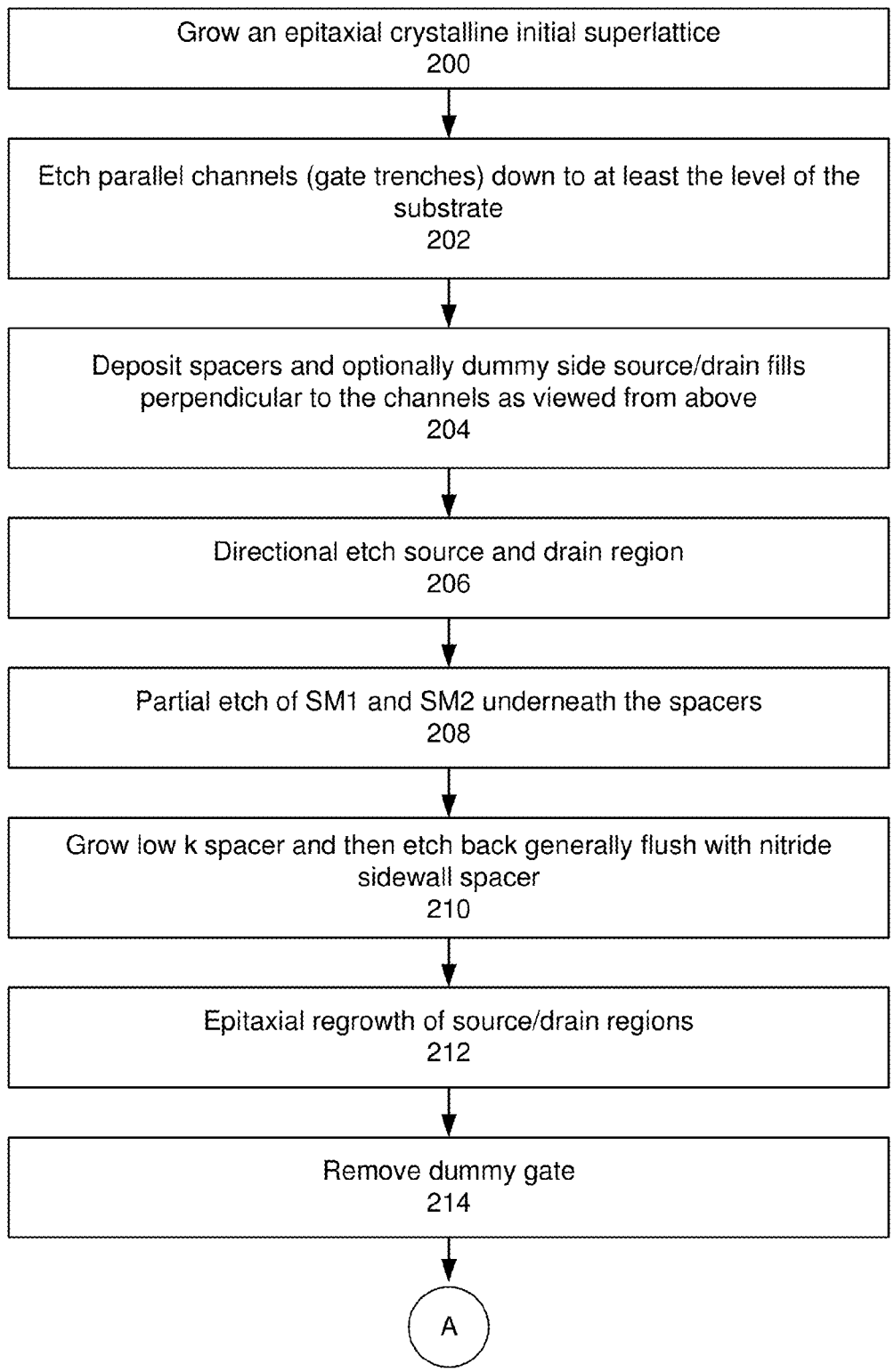
FIGS. 2A and 2B are diagrams illustrating in further detail a process for fabricating a field effect transistor (FET) comprising a biaxially strained nanosheet stack.
Figure 2B:
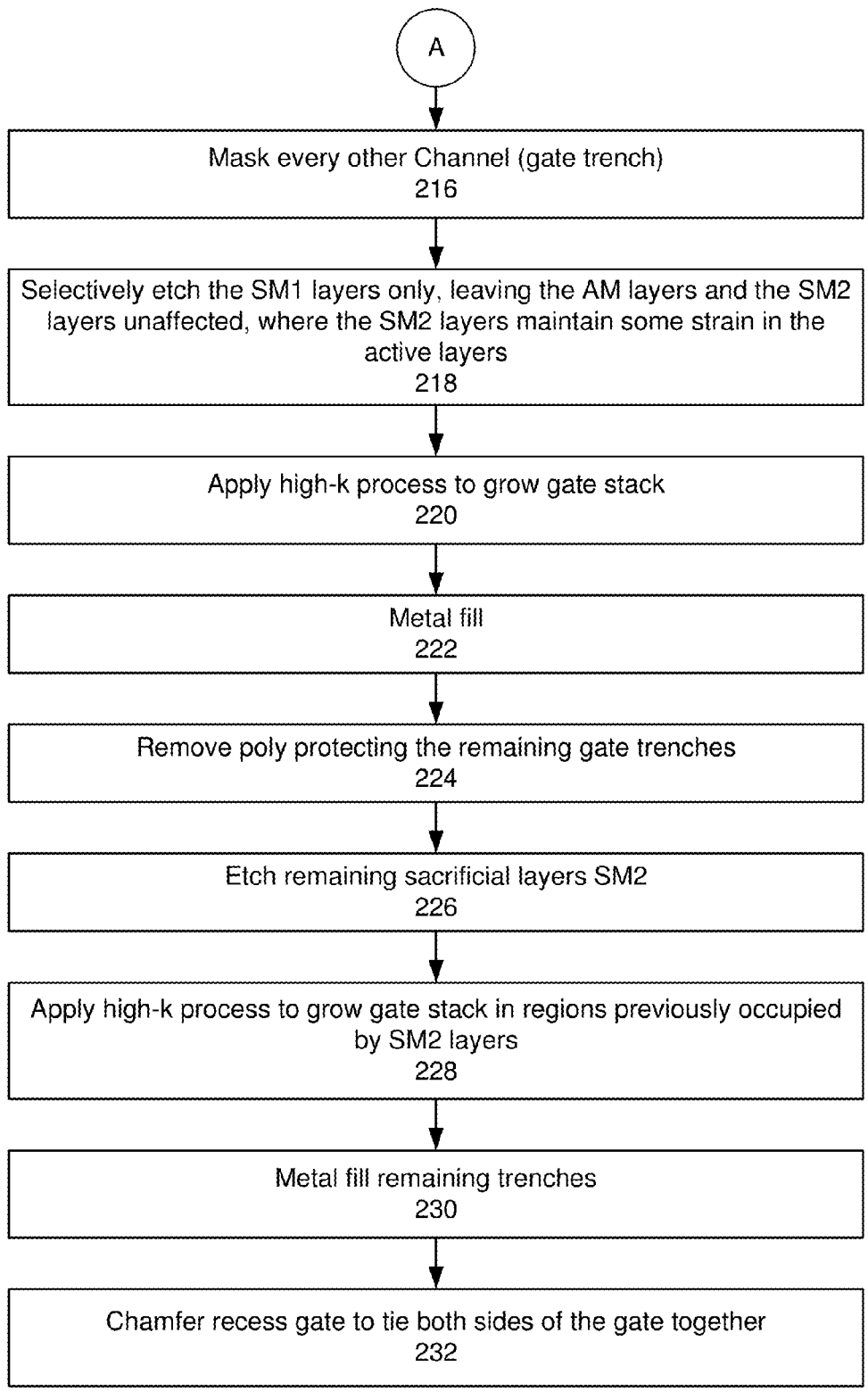

FIGS. 2A and 2B are diagrams illustrating in further detail a process for fabricating a field effect transistor (FET) comprising a biaxially strained nanosheet stack. The process may begin by growing the epitaxial crystalline initial superlattice having one or more periods of at least three layers, and where each of the active material layers are placed between first and second sacrificial material layers (block 200).

Figure 3A:
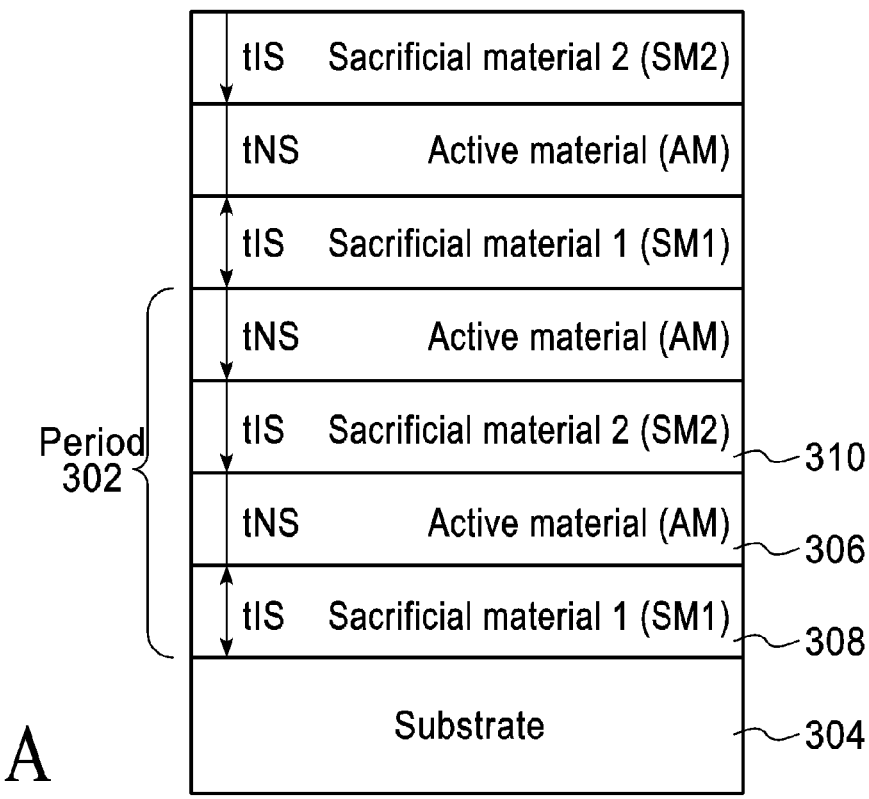
FIG. 3A is a diagram illustrating a cross-sectional view of an example superlattice according to one embodiment.
Figure 3B:
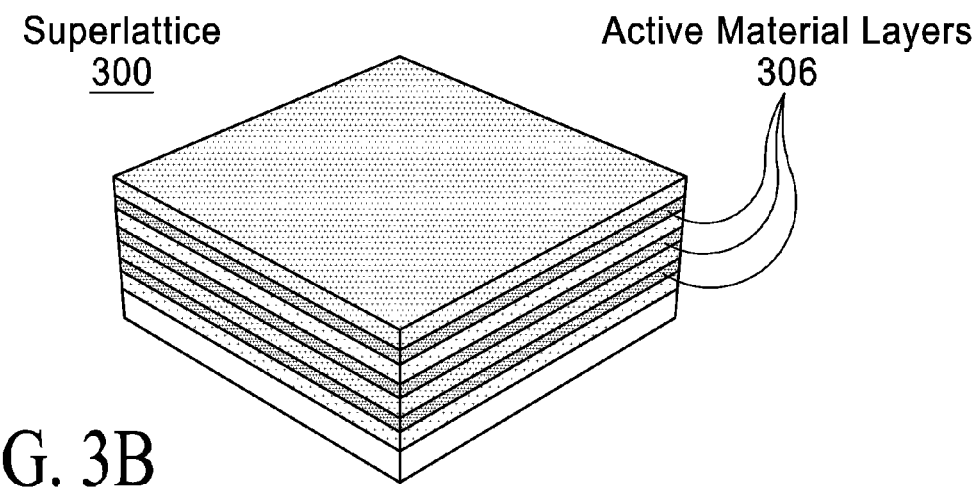
FIG. 3B is a diagram illustrating an isometric view of the example superlattice.

FIG. 3A is a diagram illustrating a cross-sectional view of an example superlattice according to one embodiment. FIG. 3B is a diagram illustrating an isometric view of the example superlattice. The superlattice 300 comprises one or more periods 302 grown over a substrate 304, where each of the periods 303 comprises at least three layers, an active material (AM) layer 306, a first sacrificial material (SM1) layer 308 and a second sacrificial material (SM2) layer 310. In the example shown, the superlattice 300 includes one and three-quarter periods 302, where each period 302 is comprised of four layers of one of three materials—the active material, the first sacrificial material, and the second sacrificial material. In this example embodiment, the four layers of each period 302 may be grown in the following order: the first sacrificial material, the active material, the second sacrificial material, and the active material (SM1/AM/SM2/AM). Note that the active material layer 306 is located between the first sacrificial material layer 308 and the second sacrificial material layer 310. Stated differently, the first and second sacrificial layers 306 and 308 lie adjacent to respective sides (e.g., top and bottom) of every active material layer 306.

In one embodiment, the active material (AM) layer 306 may comprise silicon, the first sacrificial material (SM1) layer 308 may comprise $ZnS_xSe_{1-x}$, and the second sacrificial material (SM2) layer 310 may comprise $GaP_yAs_{1-y}$. The alloy ratios x and y may be chosen to introduce a desired amount of biaxial tensile strain in the active (silicon) layers, while still admitting epitaxial growth of the superlattice with low defectivity. In this example embodiment, the active material layer 306 may be 6 nm thick, while both the first and second sacrificial material layers may be 9 nm in thickness.

Figure 4:
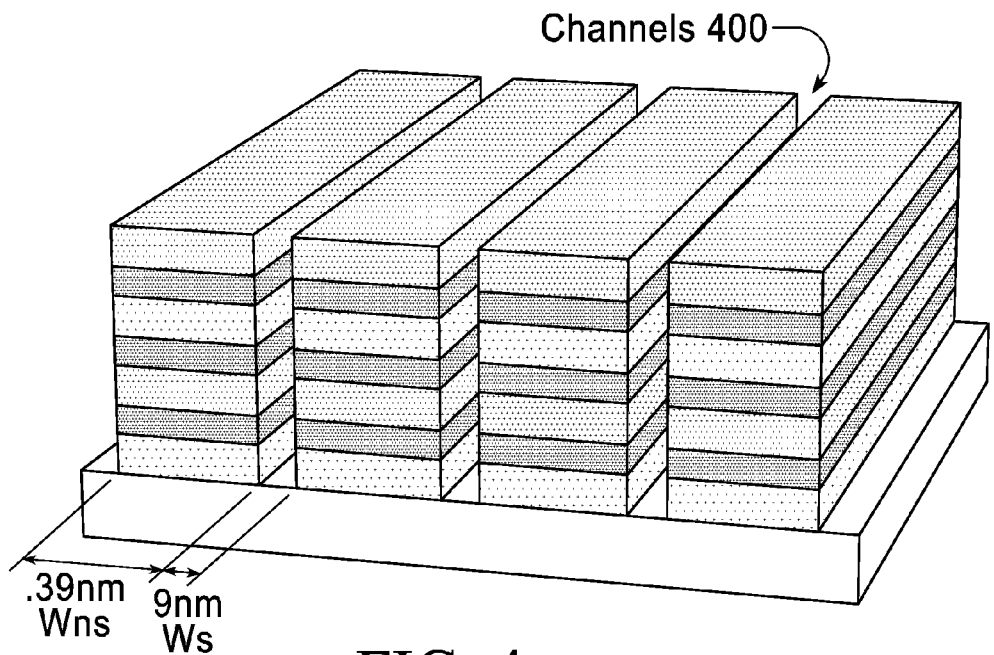
FIG. 4 is a diagram illustrating strained nanosheet stacks after etching the parallel channels, resulting in nanosheet stacks.

Referring again to FIG. 2A, parallel channels/gate trenches are etched through all layers down to at least the level of the substrate (block 202). FIG. 4 is a diagram illustrating strained nanosheet stacks after etching the parallel channels, resulting in nanosheet stacks. The width of the parallel channels 400 should be equal to a desired sheet-to-sheet distance ws (approximately 9 nm in one embodiment) and the width of the remaining material between the parallel channels should be equal to a desired width of the nanosheets Wns (approximately 39 nm in one embodiment).

Figure 5:
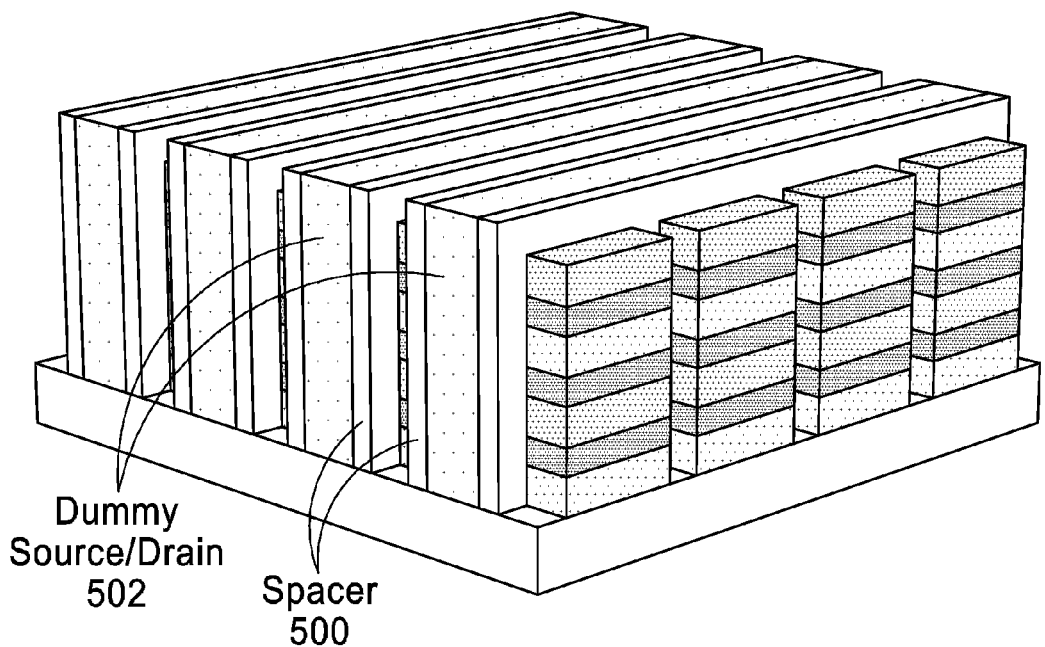
FIG. 5 is a diagram illustrating the deposition of spacers and dummy source/drain fills.

Referring again to FIG. 2A, spacers and optional dummy side source/drain fills are deposited perpendicular to the channels as viewed from above (block 204). FIG. 5 is a diagram illustrating the deposition of spacers and dummy source/drain fills. Spacers 500 and dummy source/drains 502 are deposited perpendicular to the channels. The role the spacers 500 and the dummy source/drain fills 502 is to support the nanosheets from collapsing and/or bowing during subsequent processing steps. In one embodiment, the spacers 500 may comprise nitride sidewall spacers.

Figure 6A:
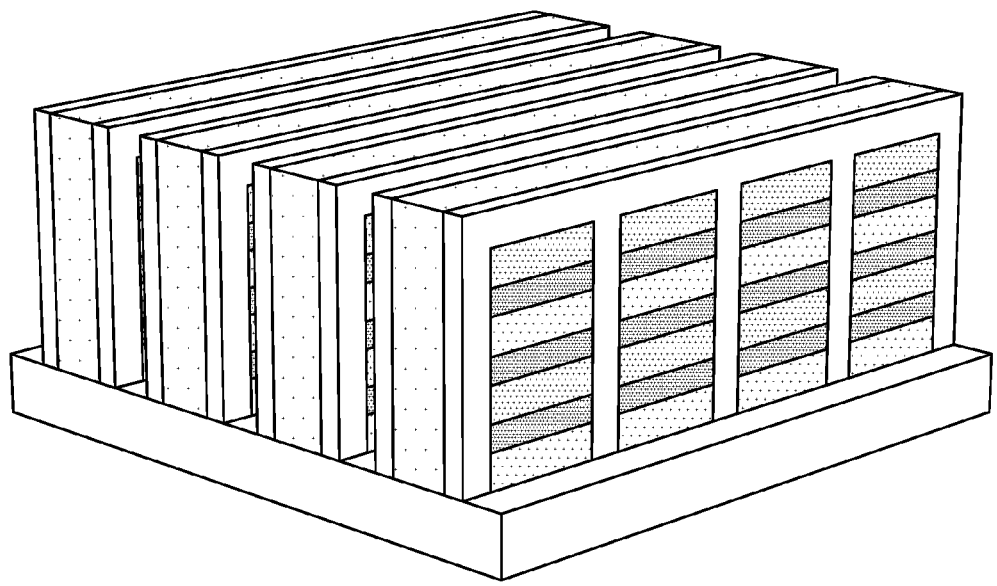
FIGS. 6A and 6B are diagrams illustrating results of the directional etch of the source and drain regions.
Figure 6B:
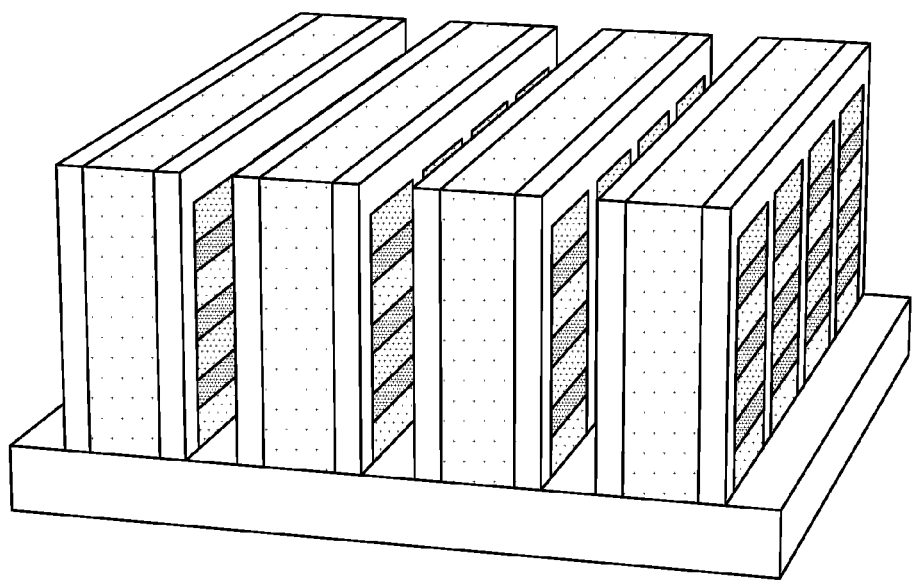

Referring again to FIG. 2A, a directional etch is performed on the source and drain regions of the nanosheets (block 206). FIGS. 6A and 6B are diagrams illustrating results of the directional etch of the source and drain regions. In another alternative embodiment, the two step process may be applied to the active nanosheet layers in the source/drain region instead of or in addition to the channel regions.

Figure 7A:
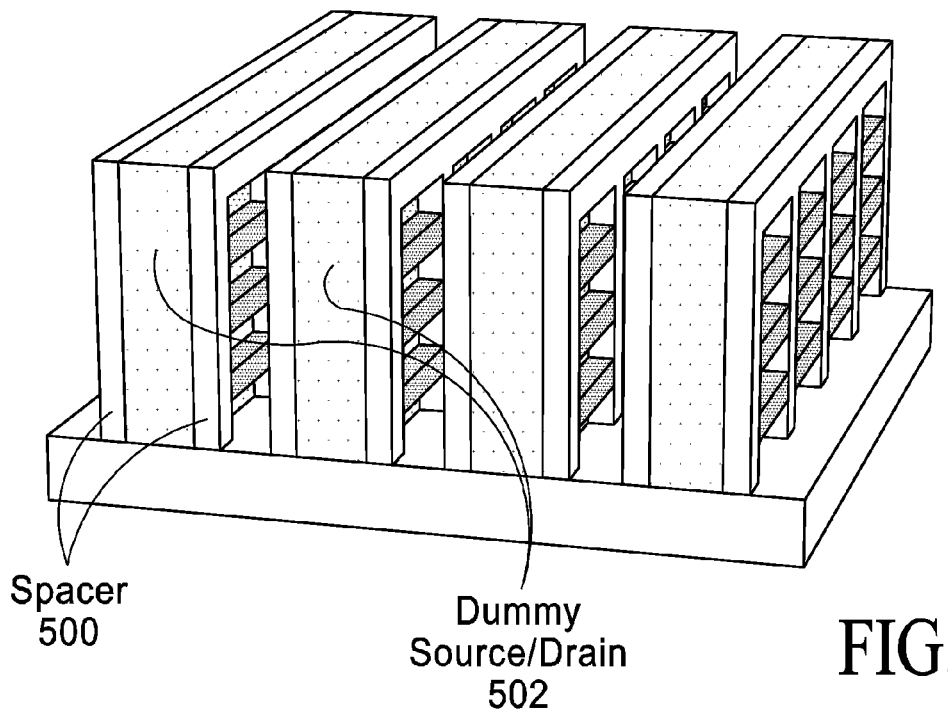
FIGS. 7A and 7B are diagrams illustrating results of the partial etch performed on SM1 and SM2.
Figure 7B:
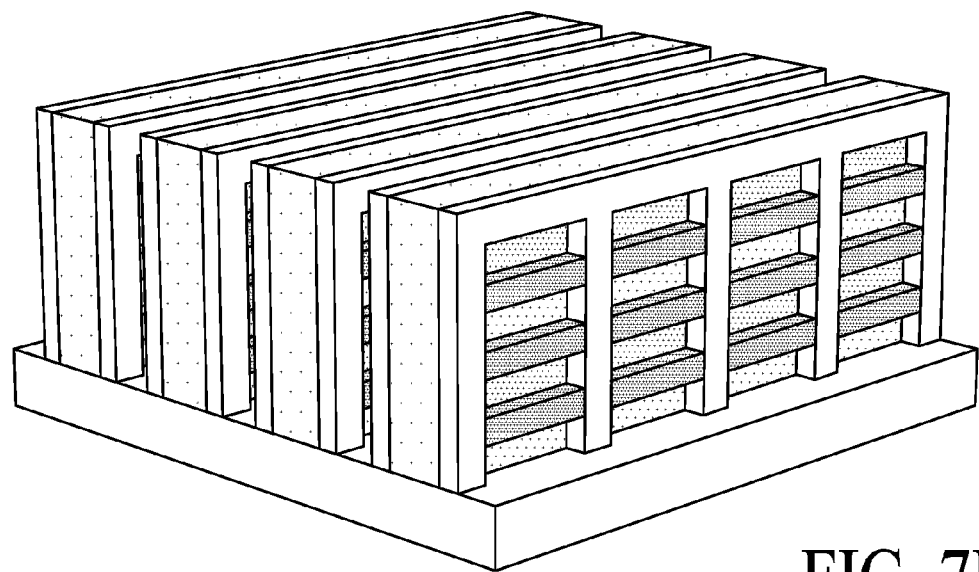

Referring again to FIG. 2A, a partial etch is performed on the first sacrificial material layer (SM1) and the second sacrificial material layer (SM2) underneath the spacers (block 208). FIGS. 7A and 7B are diagrams illustrating results of the partial etch performed on SM1 and SM2. In one example embodiment, the distance of etch from the edge of the spacer may be approximately 5 nm.

Figure 8A:
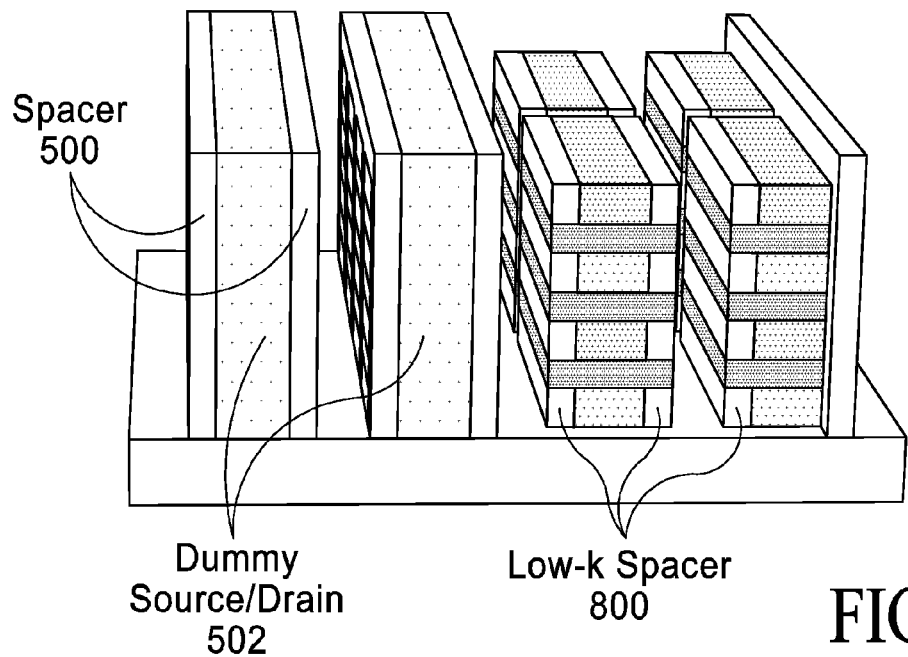
FIGS. 8A and 8B are diagrams illustrating results of the growth of the low-k spacer and subsequent etching.
Figure 8B:
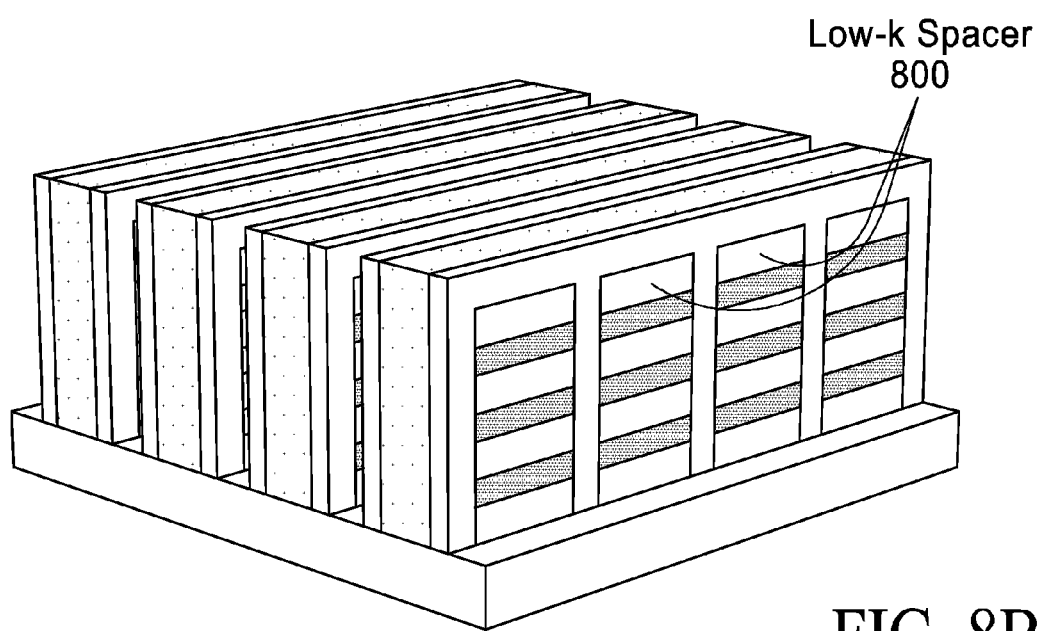

Referring again to FIG. 2A, a low-k spacer is grown and then etched back generally flush with spacers (block 210). FIGS. 8A and 8B are diagrams illustrating results of the growth of the low-k spacer and subsequent etching, with portions of the spacers 500 and dummy source/drains 502 removed for viewing convenience.

Figure 9A:
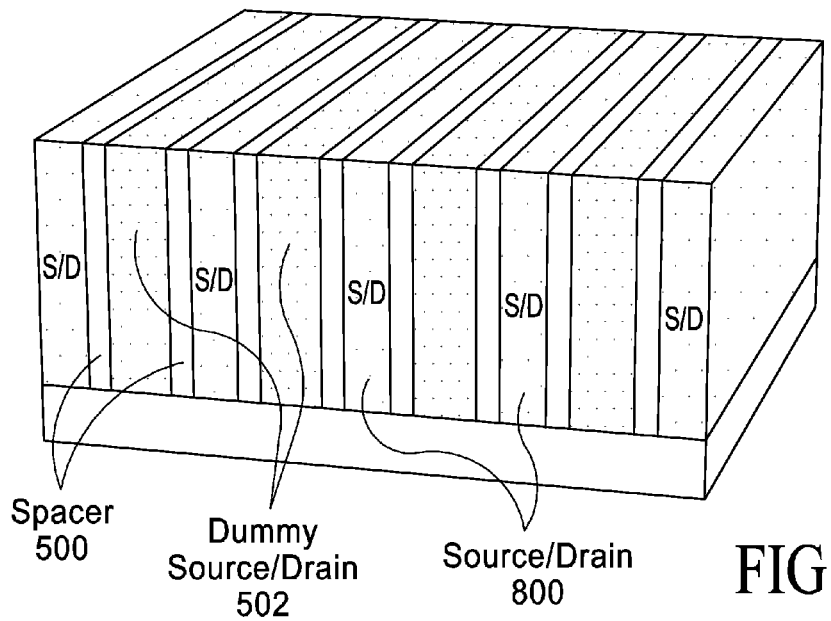
FIGS. 9A and 9B are diagrams illustrating results of the epitaxial regrowth of the source/drains regions.
Figure 9B:
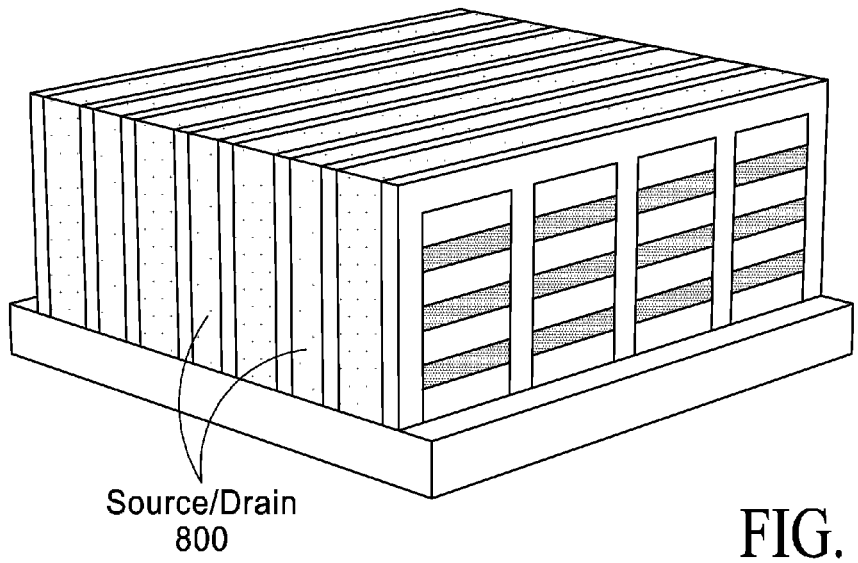

Referring again to FIG. 2A, an epitaxial regrowth of the source/drain regions is performed (block 212). FIGS. 9A and 9B are diagrams illustrating results of the epitaxial regrowth of the source/drains regions.

Figure 10A:
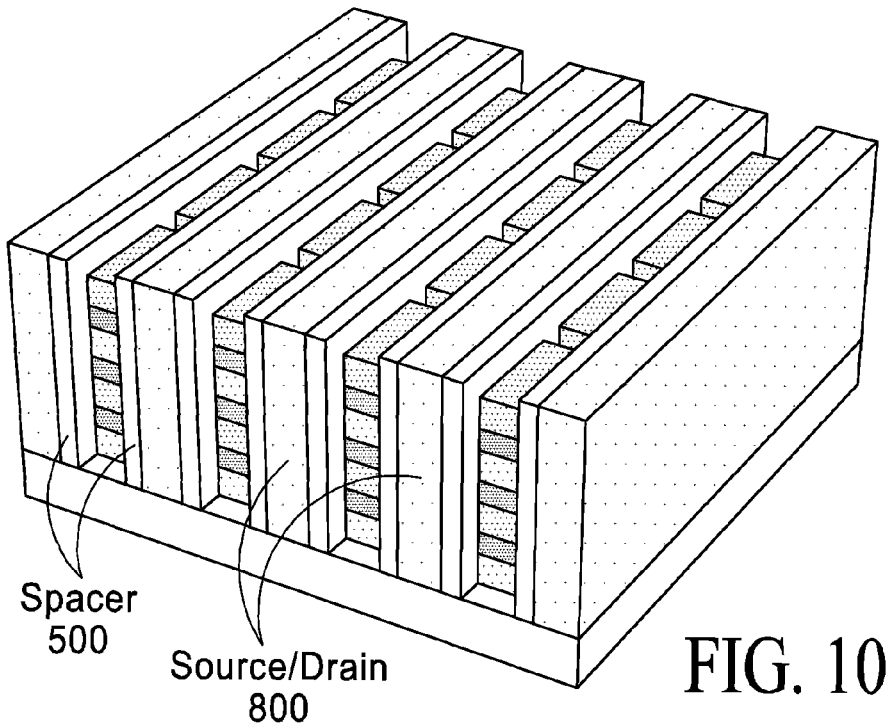
FIGS. 10A and 10B are diagrams illustrating results of removing the dummy source/drain fills.
Figure 10B:
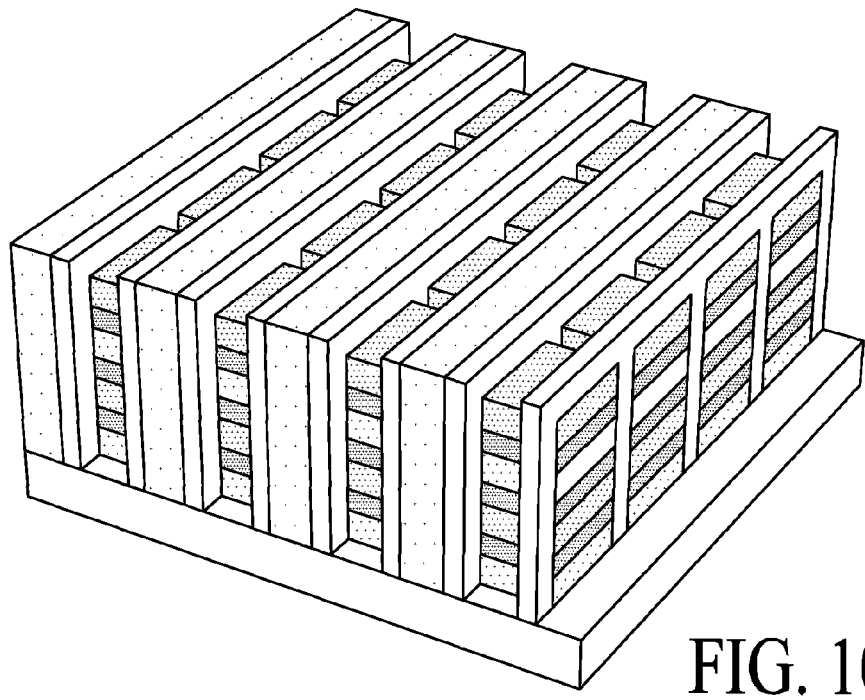

Referring again to FIG. 2A, the dummy source/drain fills 502 are removed (block 214). FIGS. 10A and 10B are diagrams illustrating results of removing the dummy source/drain fills 502.

Figure 11A:
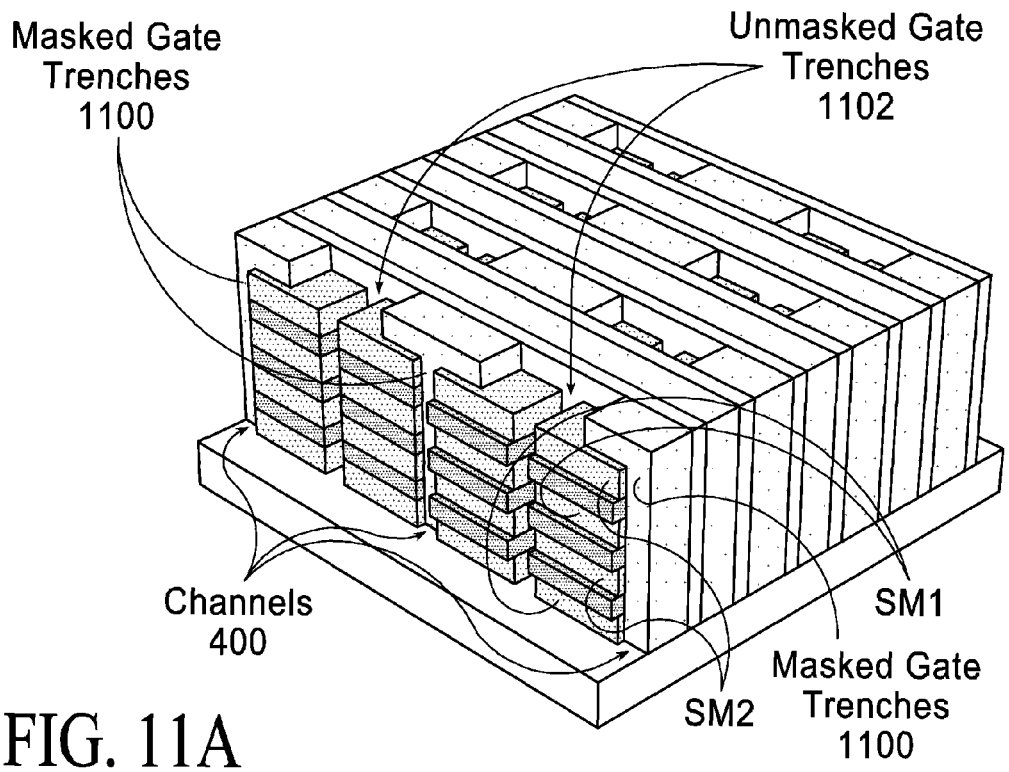
FIGS. 11A and 11B are diagrams illustrating results of masking every other the channel/gate trench.
Figure 11B:
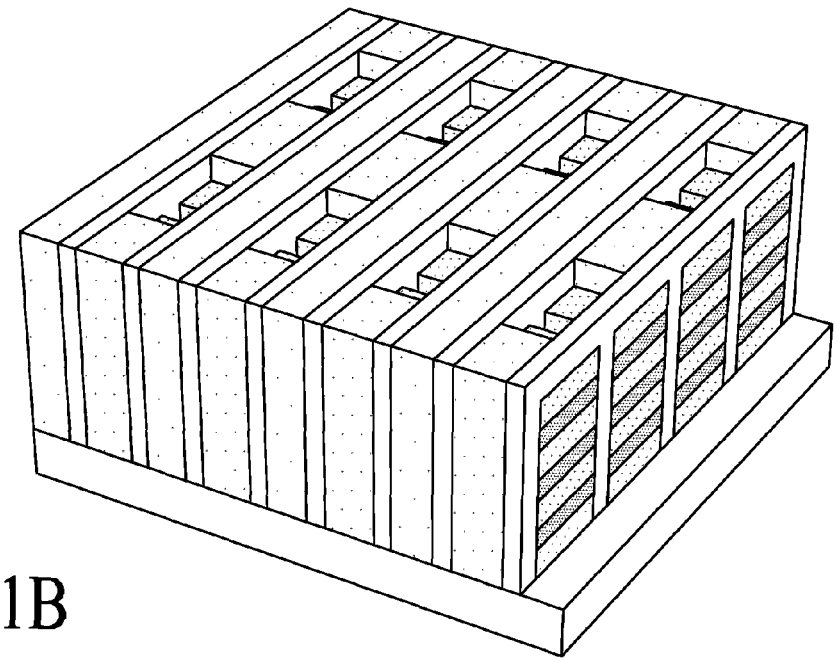

Referring now to FIG. 2B, every other channel/gate trench is masked (block 216). FIGS. 11A and 11B are diagrams illustrating results of masking every other channel/gate trench 400, resulting in masked gate trenches 1100 and unmasked gate trenches 1102.

Figure 12:
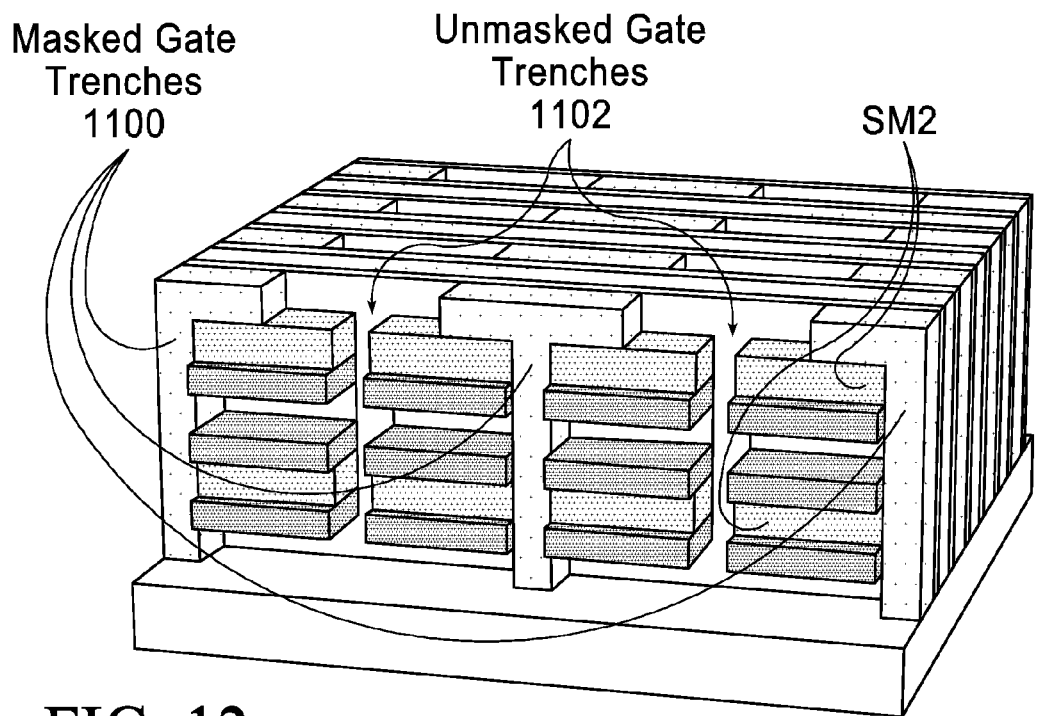
FIG. 12 is a diagram illustrating results selectively etch the SM1 layers only, leaving the SM1 layers.

Referring again to FIG. 2B, only the SM1 layers are selectively masked, leaving the AM layers and the SM2 layers unaffected, where the SM2 layers maintain some strain in the active layers (block 218). FIG. 12 is a diagram illustrating results selectively etch the SM1 layers only, leaving the SM1 layers as shown.

Figure 13:
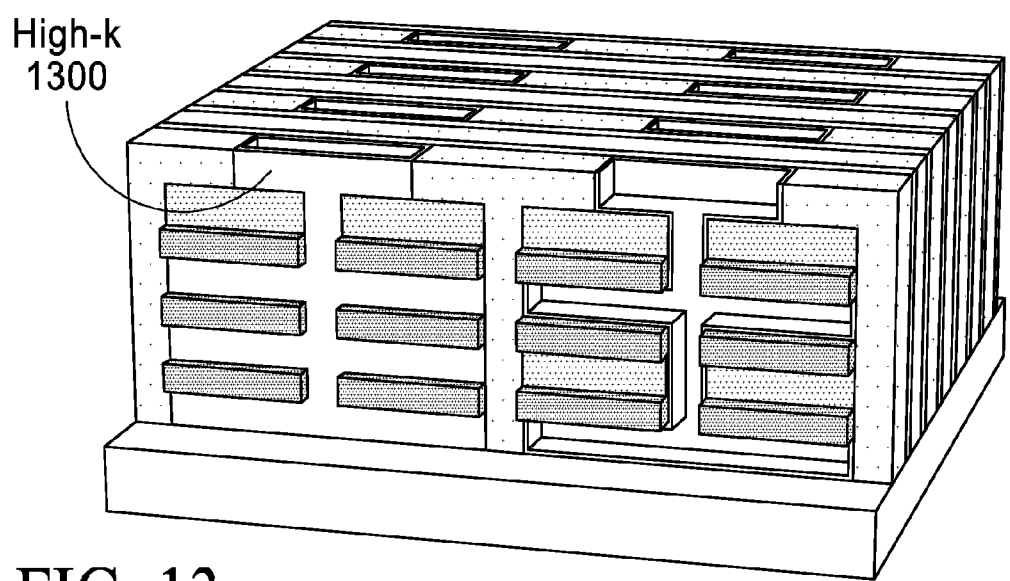
FIG. 13 is a diagram illustrating results of applying a high-K process to the unmasked channels/gate trenches.

Referring again to FIG. 2B, a high-k process is applied to the unmasked channels/gate trenches 1102 to grow the gate stack (block 220). FIG. 13 is a diagram illustrating results of applying a high-k 1300 process to the unmasked channels/gate trenches 1102.

Referring again to FIG. 2B, a metal fill is performed on the channels/gate trenches (block 222). The gate stack and the fill should be able to maintain biaxial strain during the next few processing steps when the remaining sacrificial layers SM2 are removed. FIGS. 14A and 14B are diagrams illustrating results of the metal fill. Note, the same high-k and metal fill process is applied to both sides of each channel, but the high-k layer is removed in FIG. 14 for illustrative purposes in order to show that the channel is filled with metal.

Figure 15A:
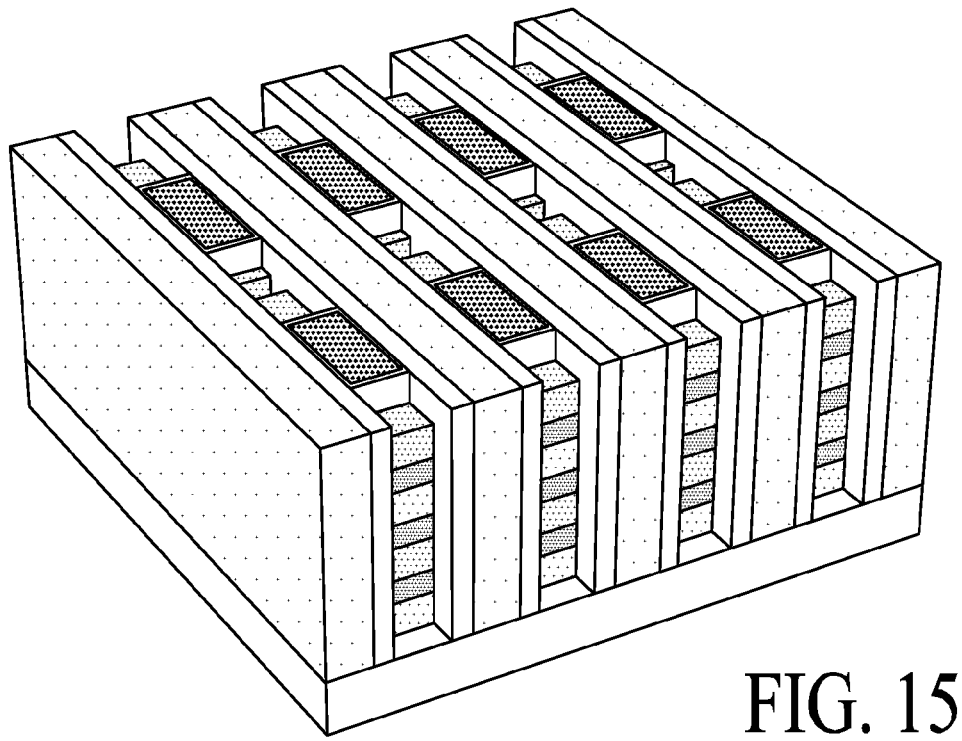
FIGS. 15A and 15B are diagrams illustrating results of removing the source/drain poly.
Figure 15B:
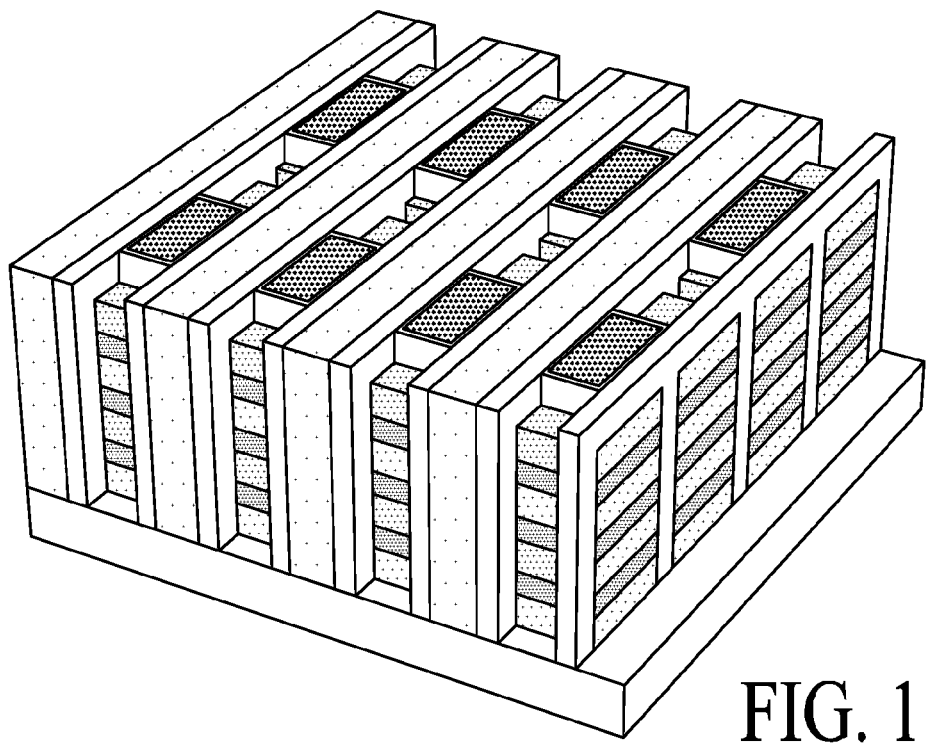

Referring again to FIG. 2B, the source/drain 800 poly fill in the remaining channel/gate trenches is removed (block 224). FIGS. 15A and 15B are diagrams illustrating results of removing the source/drain poly.

Figure 16A:
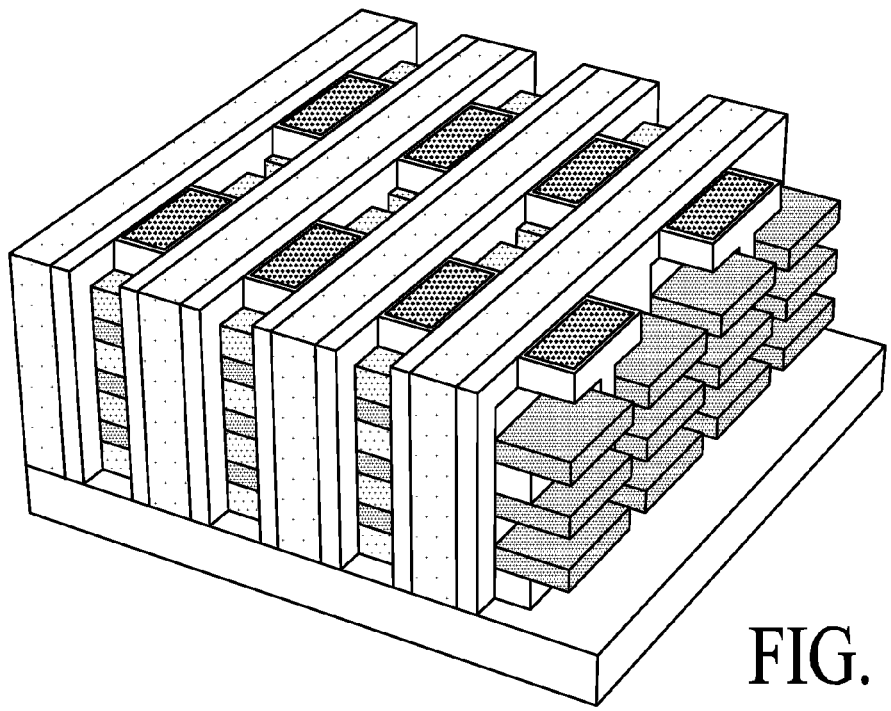
FIGS. 16A and 16B are diagrams illustrating results of etching SM2.
Figure 16B:
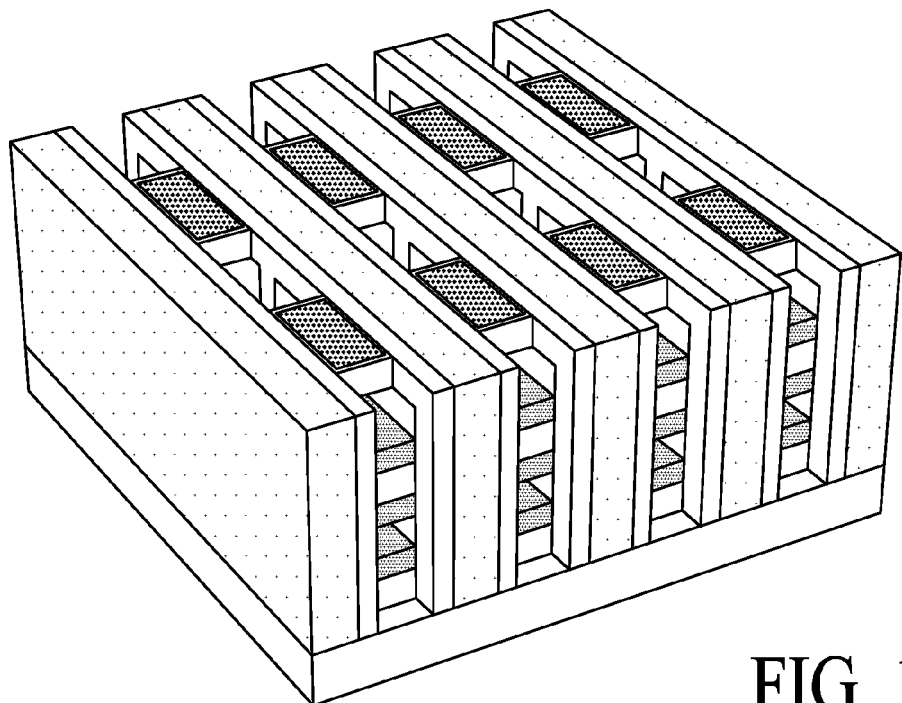

Referring again to FIG. 2B, the remaining sacrificial material SM2 is etched (block 226). FIGS. 16A and 16B are diagrams illustrating results of etching SM2.

Figure 17A:
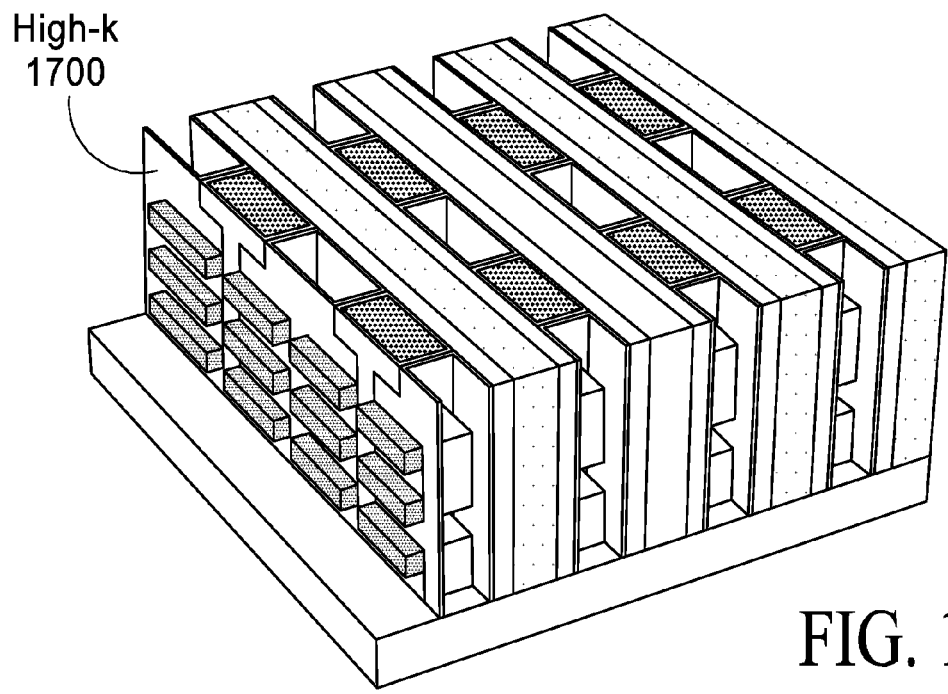
FIGS. 17A and 17B are diagrams illustrating results of applying the high-k.
Figure 17B:
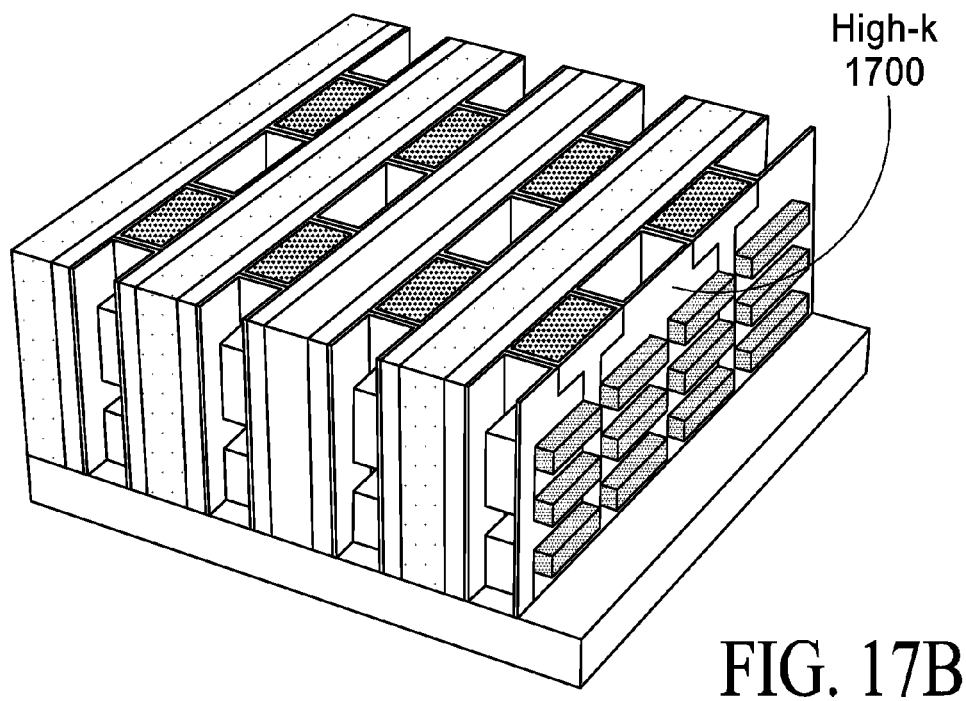

Referring again to FIG. 2B, a high-k process is applied to grow gate stack in regions previously occupied by the SM2 layers (block 228). FIGS. 17A and 17B are diagrams illustrating results of applying the high-k 1700.

Figure 18A:
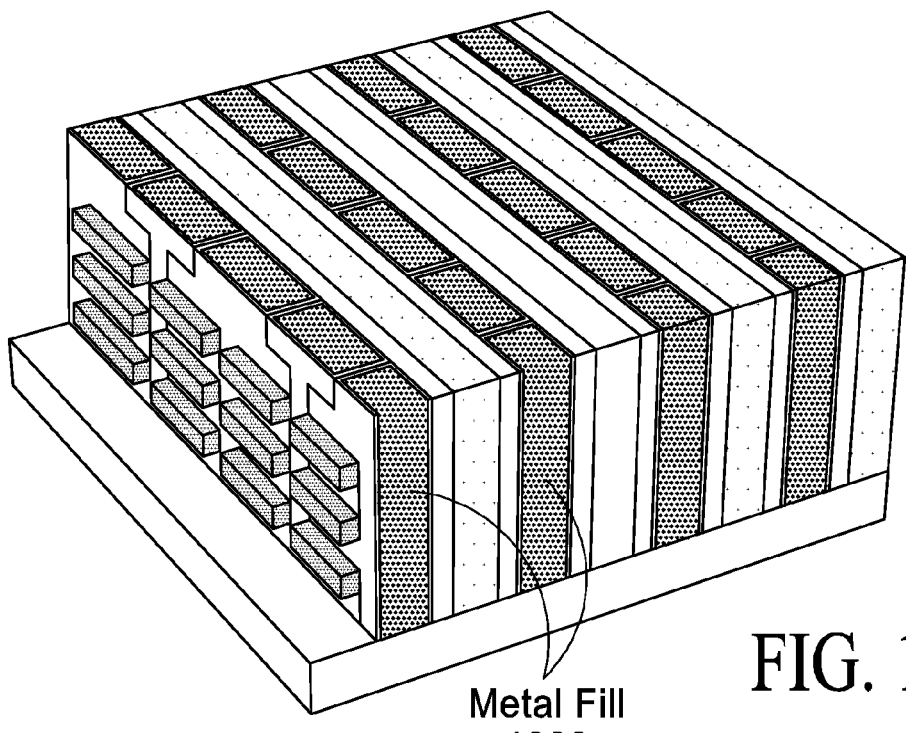
FIGS. 18A and 18B are diagrams illustrating results of applying the metal fill.
Figure 18B:
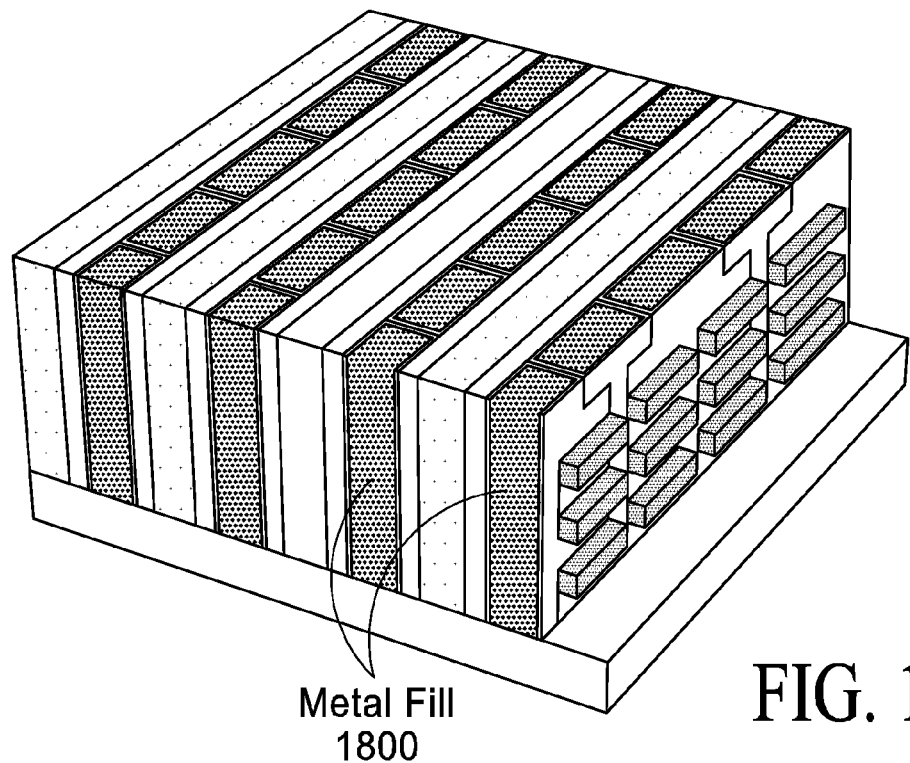

Referring again to FIG. 2B, metal fill is applied in the remaining gate trenches (block 230). FIGS. 18A and 18B are diagrams illustrating results of applying the metal fill 1800.

Figure 19A:
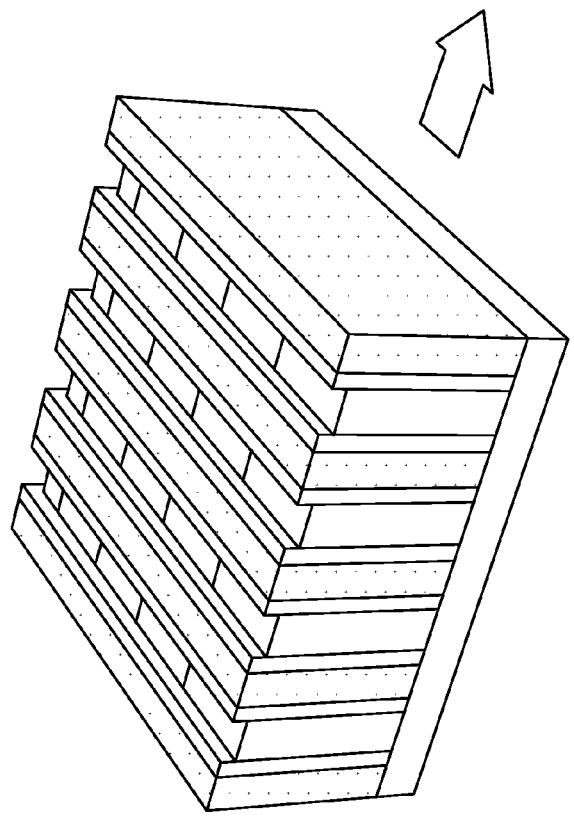
FIGS. 19A and 19B are diagrams illustrating results of chamfering the recess gate.
Figure 19B:
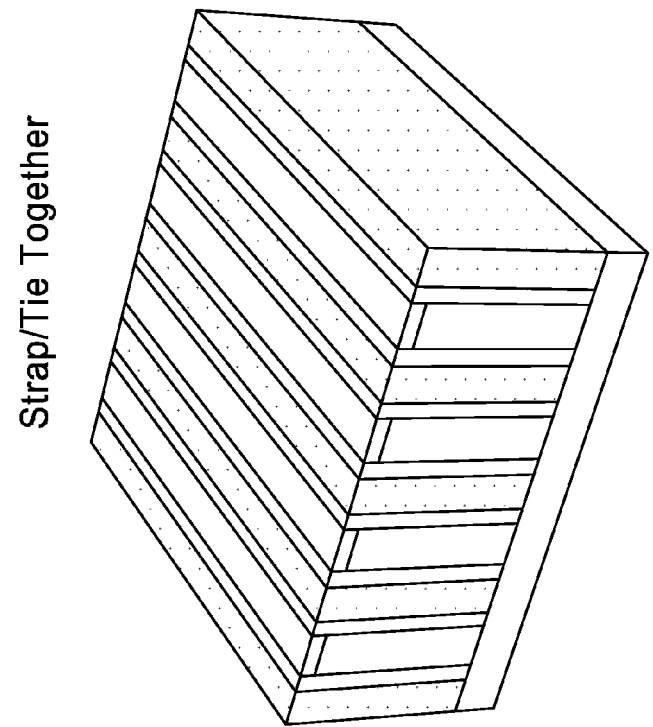

Referring again to FIG. 2B, the recess gate is chamfered to tie/strap both sides of the gate together (block 232). FIGS. 19A and 19B are diagrams illustrating results of chamfering the recess gate.

In one alternative embodiment, the source/drain etch (block 206) may be modified as follows. Only the sacrificial material layers (SM1 and SM2) are selectively etched leaving the active material layers intact. The remaining steps are the same as in the described embodiment above assuming that the source/drain regrowth (block 208) can proceed from the un-etched active layers in the source drain regions. By not etching the active layers some additional uniaxial strain may be maintained in the direction of transport, thus the final structure will have more strain in the direction of transport than in the lateral direction.

A method and system for fabricating a biaxially strained nanosheet has been disclosed. The present invention has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

We claim:

1. A method for fabricating a biaxially strained nanosheet, the method comprising:
    growing an epitaxial crystalline initial superlattice having one or more periods, each of the periods comprising at least three layers, an active material layer, a first sacrificial material layer and a second sacrificial material layer, the first and second sacrificial material layers having different material properties;
    in each of the one or more periods, placing each of the active material layers between the first and second sacrificial material layers, wherein lattice constants of the first and second sacrificial material layers are different than the active material layer and impose biaxial stress in the active material layer;
    selectively etching away all of the first sacrificial material layers thereby exposing one surface of the active material for additional processing, while the biaxial strain in the active material layers is maintained by the second sacrificial material layers; and
    selectively etching away all of the second sacrificial material layers thereby exposing a second surface of the active material layers for additional processing.

2. The method of claim 1, further comprising: after the first and second sacrificial material layers are selectively etched, depositing materials in regions where the first and second sacrificial material layers were selectively etched away, maintaining the biaxial strain in the active layers.

3. The method of claim 2, wherein depositing the materials further comprises: depositing a first gate stack in regions where the first sacrificial material layers were selectively etched away, the first gate stack capable of maintaining the biaxial strain.

4. The method of claim 3, wherein depositing the materials further comprises depositing a second gate stack in regions where the second sacrificial material layers were selectively etched away.

5. The method of claim 3, wherein the biaxially strained nanosheet is tensile-strained.

6. The method of claim 5, wherein the biaxially strained nanosheet comprises a first field effect transistor (FET) type of a CMOS nanosheet FET circuit.

7. The method of claim 3, wherein the biaxially strained nanosheet is compressively-strained.

8. The method of claim 7, wherein the biaxially strained nanosheet comprises a second FET type of a CMOS nanosheet FET circuit.

9. The method of claim 3, wherein a width of the biaxially strained nanosheet ranges from 5-50 nm, a thickness of the biaxially strained nanosheet ranges from 2-10 nm, the vertical spacing between two biaxially strained nanosheets ranges from 5-20 nm, and the horizontal spacing between the biaxially strained nanosheets ranges from 5-20 nm.

10. The method of claim 9, wherein the width of the biaxially strained nanosheet ranges from 10-40 nm, the thickness of the biaxially strained nanosheet ranges from 4-7 nm, the vertical spacing between two of the biaxially strained nanosheets ranges from 7-15 nm, and the horizontal spacing between the biaxially strained nanosheets ranges from 7-15 nm.

11. The method of claim 4, wherein the first gate stack comprises first gate dielectric materials and first metal materials, and the second gate stack comprises second gate dielectric materials and second metal materials.

12. The method of claim 11, wherein the first gate stack is substantially the same as the second gate stack.

13. The method of claim 11, wherein the first gate stack is different from the second gate stack.

14. The method of claim 11, wherein the first gate stack has a first effective workfunction and the second gate stack has a second effective workfunction.

15. The method of claim 11, wherein a separation of the first metal material and the second metal material in at least one region of a nanosheet FET structure is larger than a separation of the first metal material and the second metal material from a first surface and second surface of the nanosheet, respectively.

16. The method of claim 15, wherein the separation of the first metal material and second metal material in the at least one reason region of the nanosheet FET comprises adjacent layers of first gate dielectric materials and second gate dielectric materials.

17. The method of claim 11, wherein the first metal material and second metal material are connected together in at least one region of a nanosheet FET structure.

18. The method of claim 11, wherein the first metal material and second metal material are not connected together in at least one region of a nanosheet FET structure.

19. The method of claim 1, wherein the active material layers are at least one of i) silicon, ii) silicon and germanium, and iii) germanium.

20. The method of claim 19, wherein one of the first and second sacrificial material layers are a III-V alloy, and the other sacrificial material layers are a different, chemically dissimilar III-V alloy.

21. The method of claim 19, wherein one of the first and second sacrificial material layers are a III-V alloy, and the other sacrificial material layers are a different, chemically dissimilar II-VI alloy.

22. The method of claim 19, wherein one of the first and second sacrificial material layers are a II-VI alloy, and the other sacrificial material layers are a different, chemically dissimilar II-VI alloy.

23. The method of claim 1, wherein the active material layers are a III-V alloy.

24. The method of claim 23, wherein the first sacrificial material layers are a different III-V alloy than the active material layers and the second sacrificial material layers are a different III-V alloy from the active material layers and the first sacrificial material layers, wherein each of the III-V alloys are chemically dissimilar in order to allow for highly selective etches.

25. The method of claim 23, wherein one of the first and second sacrificial material layers are a different III-V alloy than the active material layers and the other sacrificial material layers are a II-VI alloy, wherein each of the III-V alloys are chemically dissimilar in order to allow for highly selective etches.

26. The method of claim 23, wherein one of the first and second sacrificial material layers are a II-VI alloy and the other sacrificial material layers are a different, chemically dissimilar II-VI alloy.

27. The method of claim 1, wherein the active material layers are a II-VI alloy.

28. The method of claim 27, wherein one of the first and second sacrificial material layers are a III-V alloy and the other sacrificial material layers are a different, chemically dissimilar III-V alloy.

29. The method of claim 27, wherein one of the first and second sacrificial material layers are a different II-VI alloy than the active material layers and the other sacrificial material layers are a III-V alloy, wherein each of the II-VI alloys are chemically dissimilar in order to allow for highly selective etches.

30. The method of claim 27, wherein the first sacrificial material layers are a different II-VI alloy than the active material layers and the second sacrificial material layers are a different II-VI alloy from the active material layers and the first sacrificial material layers, wherein each of the II-VI alloys are chemically dissimilar in order to allow for highly selective etches.

* * * * *